United States Patent [19]

Snijder

[11] 4,280,068
[45] Jul. 21, 1981

[54] BULK CHANNEL CHARGE COUPLED DEVICE HAVING IMPROVED INPUT LINEARITY

[75] Inventor: Pieter J. Snijder, Eindhoven, Netherlands

[73] Assignee: U.S. Philips Corporation, New York, N.Y.

[21] Appl. No.: 154,252

[22] Filed: May 29, 1980

Related U.S. Application Data

[63] Continuation of Ser. No. 937,311, Aug. 28, 1978, abandoned.

[30] Foreign Application Priority Data

Sep. 9, 1977 [NL] Netherlands .......................... 7709916

[51] Int. Cl.³ ....................... G11C 19/28; H01L 29/78
[52] U.S. Cl. .................................. 307/221 D; 357/24
[58] Field of Search ..................... 357/24; 307/221 D; 937/311

[56] References Cited

U.S. PATENT DOCUMENTS 4,012,759 3/1977 Esser ........................................ 357/24
4,142,109 2/1979 Knauer ............................. 307/221 D

OTHER PUBLICATIONS

Sequin et al., "Linearity of Electrical Charge Injection into Charge Coupled Devices", IEEE J. Solid-State Circuits, vol. sc-10 (4/75), pp. 81-92.
Esser, "The Peristaltic Charge Coupled Device", TK 7872.c6c5, 1973, Proc. CCD Applications Conference, San Diego (9/73), pp. 269-277.
Esser, "Peristaltic Charge Coupled Devices . . . ", pp. 343-425, in Jespers et al., Eds., *Solid State Imaging* Noorhoff, Leyden, Neth. (1976), Tk 8315.n3, 1975.

*Primary Examiner*—Gene M. Munson
*Attorney, Agent, or Firm*—Thomas A. Briody; Robert T. Mayer; Steven R. Biren

[57] ABSTRACT

In bulk channel charge coupled devices the nonlinearity in the input characteristic caused by varactor effects is removed by moving the potential well in which the charge packets are generated below the input electrode to the surface where the center of electrical charge is substantially independent of the value of the charge. Said shift can be obtained by external means, for example an extra d.c. voltage at the input electrode, or by internal means, for example a thicker oxide below the input electrode.

4 Claims, 7 Drawing Figures

BULK CHANNEL CHARGE COUPLED DEVICE HAVING IMPROVED INPUT LINEARITY

This is a continuation of application Ser. No. 937,311, filed Aug. 28, 1978, now abandoned.

BACKGROUND OF THE INVENTION

The invention relates to a charge coupled device comprising a semiconductor body having a semiconductor layer of at least substantially one conductivity type situated at a surface, means to deplete the semiconductor layer over its whole thickness at least in the absence of a supply of majority charge carriers while avoiding breakdown, a row of electrodes provided on the surface of the body above the semiconductor layer and separated therefrom by a barrier junction and connected to voltage sources for applying clock voltages as a result of which potential wells for storing and transporting information-representing charge packets are generated in the interior of the semiconductor layer and separated from the surface, an input stage having a zone which constitutes a source of charge carriers and an input electrode situated between said zone and the said electrode regions and separated from the body by an insulating layer, by means of which electrode a potential well can be induced in the semiconductor layer, and an input signal source for supplying an input signal in the form of a voltage difference between the source of charge carriers and the input electrode which determines the size of a packet of charge carriers which flow from the source in the potential well below the input electrode.

Charge coupled devices with bulk transport are generally known and are often referred to in literature by the abbreviations bccd (buried channel charge coupled device) and pccd (peristaltic charge coupled device). These devices are distinguished in particular in that the transport of the charge packets can take place—at least substantially—not along the surface of the semiconductor body, but at some distance therefrom, in the interior of the semiconductor layer. As a result of this, the transport efficiency is not or at least substantially not influenced by surface states. Since furthermore the charge transport can take place under the influence of comparatively strong electric fields as a result of a comparatively large distance between the charge packets and the electrodes, devices of this type generally show a very high speed.

The zone which constitutes the source of charge carriers may be connected to the signal source via an ohmic connection. However, said zone may alternatively be kept at a fixed potential while the signal source is connected to the said input electrode, if desired via a clock voltage source.

For many applications it is desirable for the size of the charge packet to be formed below the input electrode to vary linearly or at least substantially linearly with the value of the input signal.

In charge coupled devices with bulk transport, potential wells are induced which are situated at a finite distance from the surface of the semiconductor body. When the size of the charge packet increases, the charge will be stored closer and closer to the surface and the associated electrode. As a result of this the capacity of the charge storage space is not constant but increases as the charge packet becomes larger so that a nonlinearity is introduced upon converting the input signal into charge packets.

SUMMARY OF THE INVENTION

It is the object of the invention to eliminate or considerably reduce said nonlinearity in the input characteristic of a charge coupled device with bulk transport.

The invention is based inter alia on the recognition that a substantially linear input capacity can be obtained by generating below the input electrode a potential well the minimum of which is situated at a depth in the semiconductor layer where comparatively very much charge can be stored so that the centers of electrical charge of the charge packets which are formed below the input electrode substantially do not change place dependent on the size of the charge packets.

A charge coupled device according to the invention is characterized in that, in order to obtain a substantially linear relationship between the size of the said charge packet and the input signal, means are present with which a potential well can be obtained below the input electrode, the minimum of which well is situated at a smaller distance from the surface of the body than the potential wells which are induced in the semiconductor layer by means of the clock voltages applied to the said electrodes.

Since, as has been found, comparatively large quantities of charge can be stored closer to the surface without great changes in capacity, a substantially linear input characteristic can be obtained in a device according to the invention.

A first preferred embodiment is characterized in that a potential well of which the minimum is situated at the surface of the semiconductor body can be formed in the semiconductor layer below the input electrode with the aid of the said means associated with the input electrode. Since the charge carriers in this embodiment can be stored directly below the insulating layer, the distance between the charge carriers and the input electrodes will substantially not vary, at least in the case of charge packets which are not too large. The input capacity will substantially not vary so that a substantially linear input characteristic can be obtained.

In this embodiment, traps at the surface of the body will influence the transport efficiency of the device only to a slight extent because, apart from the input stage, the whole further transport can take place through the interior of the semiconductor layer where the concentration of traps generally is much lower than at the surface.

The clock voltages applied to the input electrode are such that the interface between the semiconductor layer and the insulating layer changes from accumulation of majority charge carriers during the formation of charge packets into a depletion state during the transfer of the formed charge packets to the next stage of the shift register. This means that it may be necessary for the clock voltages to have a rather large amplitude (difference between maximum and minimum).

A preferred embodiment in which clock voltages can be applied to the input electrode with a generally smaller amplitude is characterized in that at least the part of the semiconductor layer underlying the input electrode comprises a surface zone of one conductivity type extending from the surface of the body down to only over a part of the thickness of the semiconductor layer and has a higher doping concentration than the adjoining part of the semiconductor layer. See, for example, FIG. 1. Such a zone can be obtained, for example, by locally increasing the concentration of impurities of one conductivity type in the semiconductor layer.

As a result of the higher doping concentration, quantities of charge carriers which are comparatively large as compared with the underlying part of the semiconductor layer can be stored in said surface zone. As a result of this, at most small capacity variations can occur upon forming charge packets below the input electrode when the minimum of the potential well is situated in said surface zone and at a distance from the surface. Since in this embodiment the charge need not be accumulated at the surface to obtain the desired linearity in the input characteristic, smaller clock voltages can generally be applied to the input electrode than in the first described example.

A further preferred embodiment is characterized in that the more highly doped surface zone of one conductivity type extends, besides below the input electrode, also below the whole row of insulated electrodes in the semiconductor layer and over a part of the thickness of the semiconductor layer. See, for example, FIG. 5. Since the doping profile below the row of clock electrodes is comparable to that below the input electrode, the storage capacities below the row of electrodes will advantageously be approximately equal to the charge storage capacity below the input electrode. Further important advantages of such a doping profile in the semiconductor layer below the clock electrodes are described inter alia in Netherlands Patent Application No. 73.03.778 and corresponding U.S. Pat. No. 4,012,759, the contents of which are to be considered as being incorporated in the present application.

For obtaining a potential well below the input electrode the minimum of which is situated at the desired small distance from the surface, there still exist several possibilities which, whether or not in combination with each other, may be used advantageously. For example, the input electrode may be provided on an insulating layer, for example an oxide layer, the thickness of which exceeds that of the barrier layer separating the clock electrodes from the semiconductor layer, as shown, for example, in FIG. 7. Another possibility is to further increase the doping concentration of impurities of one conductivity type below the input electrode. Other techniques may be used in which the desired asymmetry is obtained by means of differences between the input stage and the subsequent shift register incorporated in the semiconductor structure itself. A preferred embodiment which inter alia has the advantage that the manufacture of the device is simplified by using external means (that is means situated outside the semiconductor structure) is characterized according to the invention in that the input electrode is connected to a voltage source by means of which clock voltages can be applied to the input electrodes, which clock voltages differ from the clock voltages to be applied to the row of electrodes. For example, the input electrode may be connected to a separate clock voltage source or, via a d.c. source voltage, to the same clock voltage source with which clock voltages can be applied to the clock electrodes.

BRIEF DESCRIPTION OF THE DRAWING

The invention will now be described in greater detail with reference to a few embodiments and the associated diagrammatic drawing, in which.

It is to be noted that the figures are diagrammatic and are not drawn to scale.

Figure 1:
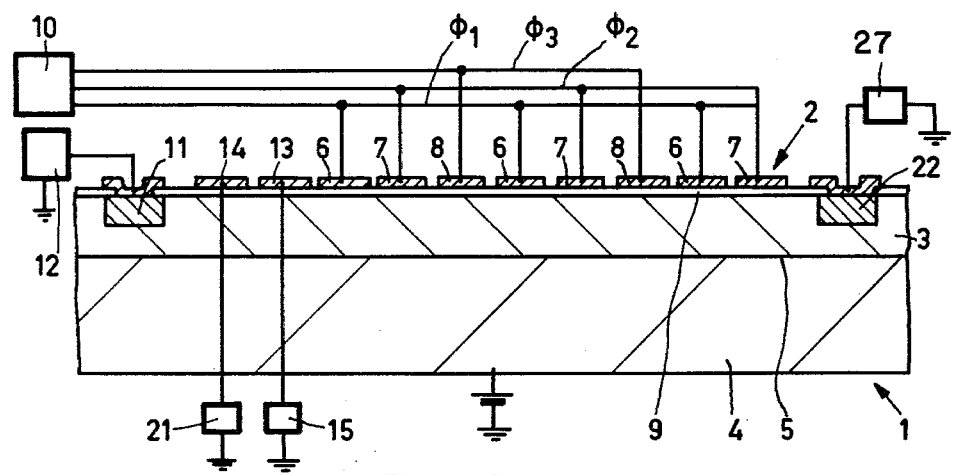
FIG. 1 is a sectional view of a charge coupled device according to the invention.

FIG. 1 is a sectional view of a charge coupled device with bulk transport. Such devices in which the charge transport takes place in the interior of the semiconductor material are often referred to in the literature by the abbreviations pccd (peristaltic charge couled device) or bccd (buried channel ccd). The device comprises a semiconductor body 1 having an n-type semiconductor layer 3 which is situated at the surface 2 and in which the charge transport takes place. For that purpose the layer 3 has a thickness and a doping concentration which are so small that the layer 3 can be depleted throughout its thickness without breakdown. On its lower side—that is the side remote from the surface 2—the layer 3 may be bounded by an insulating substrate or by a MIS (metal-insulator-semiconductor) structure. In the embodiment described the semiconductor body furthermore comprises a p-type substrate 4 which forms a p-n junction 5 with the layer 3. The layer 3 is deposited on the p-type substrate in the form of an n-type epitaxial layer in a thickness of approximately 4.5 $\mu$m and a concentration of $5.10^{14}$ at/cm$^3$. The layer 3 can also be obtained by redoping by means of ion implantation of an n-type impurity in a surface region of the p-type substrate.

A row of clock electrodes 6, 7 and 8 is provided on the surface 2, the electrodes 6 being connected to the clock line $\phi 1$, the electrodes 7 being connected to the clock line $\phi 2$ and the electrodes 8 being connected to the clock line $\phi 3$. The electrodes 6, 7 and 8 are separated from the semiconductor material by a barrier layer 9. The clock electrodes may be formed by p-type semiconductor zones diffused or implanted in the semiconductor layer 3, the reverse junction 9 being formed by a p-n junction to be biased in the reverse direction. The electrodes 6–8 may alternatively be formed by metal layers which are deposited directly on the semiconductor surface and form a rectifying Schottky junction with the semiconductor material. In the present embodiment the electrodes 6–8 are provided in the form of conductor tracks of metal, for example aluminum, or of doped semiconductor material, for example polycrystalline silicon, on an insulating layer 9 of, for example, silicon oxide or another suitable dielectric, for example silicon nitride.

Figure 2:
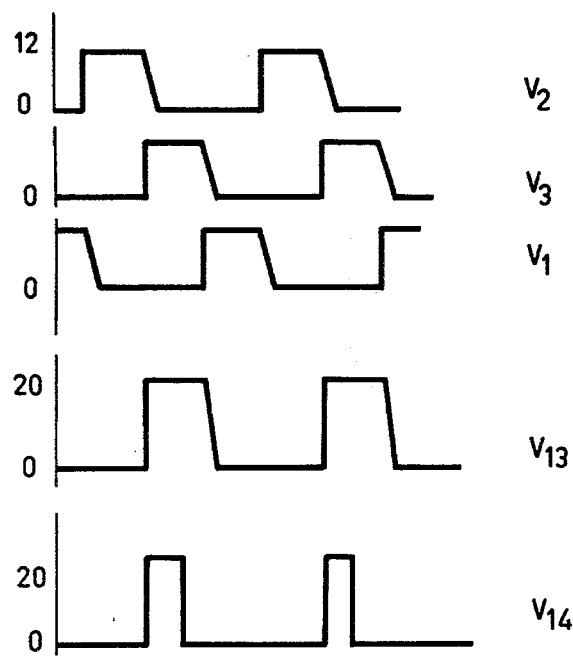
FIG. 2 shows diagrams of clock voltages to be applied to the device shown in FIG. 3 as a function of the time t.

The electrodes 6–8 are connected to a clock voltage source 10 via the clock lines $\phi 1$, $\phi 2$, and $\phi 3$. FIG. 2 shows the shape of the clock voltages V1, V2 and V3 as a function of the time t which are supplied to the electrodes 6, 7 and 8 by the source 10. By means of these clock voltages, a moving pattern of potential wells can be induced in the interior of the semiconductor layer 3, as is known, which wells are separated from each other by potential barriers and which serve to store and transport information-representing charge packets.

The charge is introduced via an input stage which is shown in FIG. 1 on the left-hand side of the device. The input stage first of all comprises a zone 11 which constitutes a source of charge carriers from which charge packets can be formed. In the present case in which the charge transport takes place in the form of electrons, said zone is formed by a highly doped n+ zone 11. This zone is connected to a voltage source 12 which is shown diagrammatically only in the drawing and (in addition to a suitable d.c. bias) provides an information-representing input signal to the input source 11, which signal is to be converted into a corresponding charge packet.

The input stage comprises in addition an input electrode 13 which is situated between the zone 11 and the clock electrodes 6–8 and which is insulated from the surface 2 by the insulating layer 9. A potential well in which a charge packet is formed in accordance with the value of the input signal which is applied to the zone 11 can be generated in the semiconductor layer 3 by means of the input electrode 13. For sampling the input signal, a sampling electrode or sampling gate 14 is provided between the zone 11 and the input electrode 13, with which the connection between the part of the layer 3 underlying the electrode 13 and between the n+ type zone 11 can be made or interrupted at will.

In charge coupled devices with bulk transport in which the potential wells for storing charge are situated in the interior of the semiconductor layer 3, the capacities between the electrodes and the charge storage sites in the layer 3 are generally not constant as a function of the quantity of charge. The result of said varying capacity at the input may be that the size of the charge packets is nonlinearly dependent on the value of the input voltage signal.

According to the invention, in order to improve the linearity in the relationship between the size of the charge packets and the input signal, means 15 are present by means of which a potential well can be obtained below the input electrode 13 the minimum of which well is situated at a smaller distance from the surface 2 than the minimum of the potential wells which are induced in the semiconductor layer 3 by means of the clock voltages at the electrodes 6, 7 and 8.

In the present embodiment these means comprise the voltage source 15 with which the voltage pattern V13 shown in FIG. 2 can be applied to the electrode 13. As will be described hereinafter, the voltage V13 assumes such values that a potential well the minimum of which is situated at the surface 2 is induced in the layer 3 below the electrode 13. The clock voltage V13 which is applied to the electrode 13 differs from the clock voltages V1–V3 which are applied to the electrodes 6–8 and have such values that the potential minimum induced in the underlying parts of the layer 3 is situated at a finite distance from the surface 2.

The operation of the device will be described in greater detail with reference to the following description with numbers which are given only by way of example and for explanation. The voltages which are preferably applied in a concrete embodiment and which depend on several parameters, such as the doping concentration and thicknesses of the various regions, can simply be chosen by those skilled in the art in such manner that an optimum effect of the device is obtained.

The earth potential (oV) is chosen as a reference potential.

The substrate 4 is set up at, for example, +5 V.

A d.c. bias of, for example, 25 V is applied to the layer 3 via the output zone 22. In this situation the semiconductor layer 3 can be depleted throughout its thickness at least below said electrodes at a voltage of 0 V at the clock electrodes 6–8 and the electrodes 13, 14.

Figure 3:
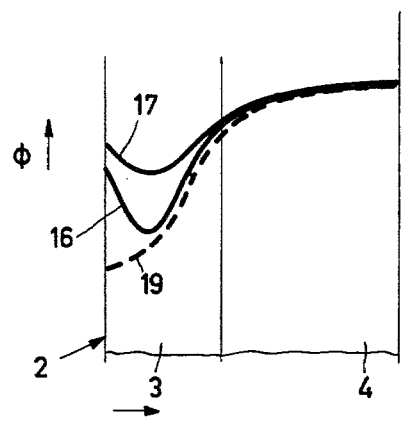
FIG. 3 shows diagrams of potentials in the body of the charge coupled device shown in FIG. 1 as a function of the distance to the surface.

The clock voltages V1–V3 which are applied to the clock electrodes 6–8 by means of the source 10 vary, as appears from FIG. 2, between two levels of 0 and +12 V, respectively. The potential profiles which are formed below the electrodes at these voltages are shown in FIG. 3 as a function of the distance d from the surface 2. Curve 16 denotes the potential in the case in which a voltage of 12 V is applied to the overlying electrode. In this case a comparatively deep potential well is formed in the charge transport layer in which well charge (electrons) can be stored. Curve 17 indicates the potential profile in the semiconductor body when a voltage of 0 V is applied to the clock electrodes. In this case the potential $\phi$ increases so that locally present electrons are transferred to an adjacent stage having a lower potential, while potential barriers are formed between successive potential wells 16 which barriers separate the various charge packets to be transported via the layer 3 from each other.

Figure 4:
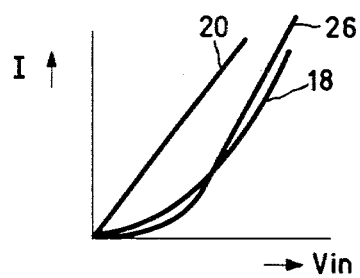
FIG. 4 shows a characteristic of the output current I of the device shown in FIG. 1 as a function of the input voltage $V_{in}$.

In the case in which the voltage source 15 supplies the same voltages to the electrode 13 as the clock voltage source 10 to the clock electrodes 6–8, a potential well will be generated in the semiconductor layer 3 below the electrode 13 which has the same shape as the curves 16, 17 in FIG. 3. The quantity of charge which can be stored in such a potential well generally is nonlinearly dependent on the value of the input signal $V_{in}$. Since, when the size of the charge packet increases, the charge is stored closer and closer to the surface 2, hence closer and closer to the electrode 13, the differential input capacity increases. In FIG. 4 in which the output current I is plotted as a function of the input voltage $V_{in}$, this nonlinear relationship is represented by the curve 18.

In order to improve the linearity, the input electrode 13 is connected to a voltage source 15 which supplies the voltage V13 to the electrode (see FIG. 2). The voltage V13, as well as the clock voltages V1–V3 vary between two levels. The lowest level of V13 is substantially equal to the lowest voltage level of the clock voltages V1–V3. The other voltage level of V13 in which charge is stored below the electrodes 13, is higher than the highest voltage level of the clock voltages V1–V3. A specific value for said voltage level depends inter alia on the d.c. voltage levels at the input and the output.

Such a value for said voltage is chosen, dependent on the d.c. voltage level at the input zone 11, for example +20 V, that during sampling the input signal a potential well is induced below the electrode 13 the minimum of which adjoins the surface 2 of the semiconductor body. Curve 19 in FIG. 3 shows the profile of such a potential well. The charge carriers (electrons) which are stored in said potential well will be accumulated, at least substantially, at the surface 2 below the oxide layer 9, that is in the capacity between the layer 3 on the one hand and the electrode 13 on the other hand with only the oxide layer as an intermediate dielectric. When the size of the charge packet increases, the center of charge does substantially not vary or varies at least much less than in a potential well the profile of which is shown by the curve 16 (FIG. 3). As a result of this, the linearity between the input signal $V_{in}$ and the output current I can be improved considerably as is shown diagrammatically by the curve 20 in FIG. 4.

During sampling of the input signal, a voltage V14 (FIG. 2) is applied in the time interval t1-t2 to the sampling electrode 14 by means of the voltage source 21, which voltage is equally large as the voltage at the electrode 13 so as to obtain a good connection between the input (11, 12) and the semiconductor region below the electrode 13 without potential thresholds. At the instant t2 the voltage V14 drops to 0 V so that the charge stored below the input electrode 13 is separated from the input by a potential barrier below the electrode 14. At the instant t3 the voltage at the electrode 13 drops to 0 V while a clock voltage of 12 V is applied to the adjacent electrode 6. Below this electrode a potential well 16 is formed in which the charge packet which is formed below the electrode 13 is transferred. In the usual CCD manner, the charge packet can be further transported through the semiconductor layer 3 to the output zone 22 and be read by means of the reading member 27 by applying the clock voltages V1-V3 to the electrodes 6, 7 and 8. The charge transport takes place entirely via the bulk of the semiconductor layer 3 at a distance from the surface 2, so that surface states have no or at least substantially no influence on the charge transport process. The charge packets are contacted with the surface 2 below the input electrode 13. However, the surface states below the electrode 13 will also be hardly of influence on the overall charge transport efficiency. Because the further charge transport takes place entirely in the interior of the semiconductor layer, the concentration of traps in the interior (bulk trap), with a comparatively large number of steps (bits) of the charge coupled device, will be of much greater influence than the surface states below the electrode 13.

Due to the invention, according to which a potential well is induced below the input electrode and the minimum of which is situated immediately below the surface 2, a bulk ccd can be obtained having an input characteristic which, as regards linearity, is comparable to that of socalled surface ccd's in which the charge transport takes place entirely along the surface. In order to transfer the charge carriers from the surface to the interior of the semiconductor layer, a comparatively large voltage step is necessary at the input electrode 13.

Figure 5:
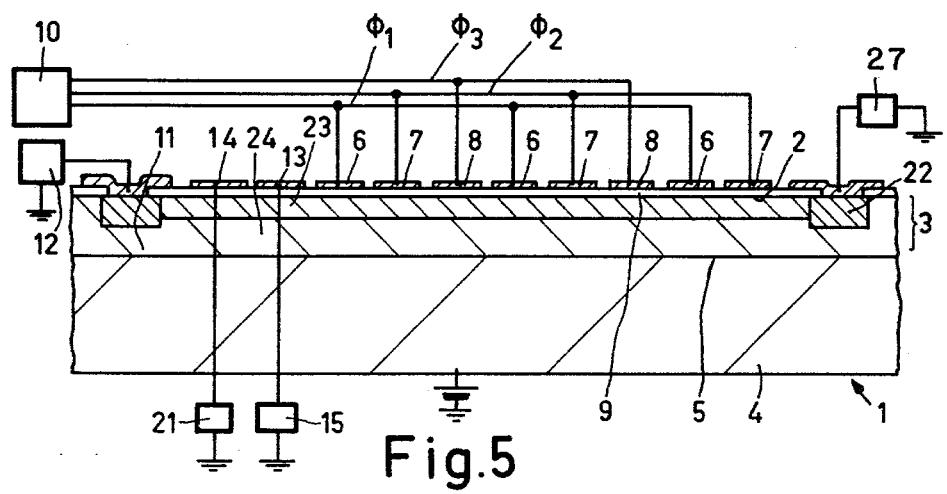
FIG. 5 is a sectional view of another embodiment of a charge coupled device according to the invention.

In the following embodiment shown in FIG. 5 it will be described in what manner the output characteristic of a bulk ccd can be improved without charge accumulation at the surface below the input electrode. The semiconductor device (for which the same reference numerals are used for corresponding components) differs from the preceding embodiment mainly only in the composition of the charge transport layer. In the preceding embodiment this layer was formed by an n-type epitaxial layer of substantially homogeneous doping concentration deposited on the p-type substrate 4. In the present embodiment the part of the layer 3 underlying the input electrode 13 comprises an n-type surface zone 23 which extends from the surface 2 of the semiconductor body 1 over a part of the thickness of the layer 3 and has a higher doping concentration than the adjoining part 24 of the layer 3 underlying the surface zone 23. Besides below the electrode 13, the n-type surface zone also extends over the adjacent part of the charge transport layer 3 below the electrodes 6-8 between the input zone 11 and the output zone 22.

For a bulk ccd of which the charge transport layer 3 has a similarly profiled doping concentration, reference is invited to Netherlands Patent Application 7303778, corresponding to U.S. Pat. No. 4,012,759, laid open to public inspection and the contents of which are to be considered as being incorporated in the present application. The layer 3 may be formed by a homogeneously doped, for example, epitaxial layer having a thickness of approximately 4.5 $\mu$m in which by means of ion implantation of approximately $2.10^{12}$ atoms per sq.cm down to a depth of approximately 0.2 $\mu$m the n+ zone is provided in which the remaining part of the epitaxial layer forms the part 24 below the zone 23 of the layer 3.

During operation, a voltage of +5 V is applied again to the substrate (by way of example) and a d.c. voltage of +25 V is applied to the output 22 of the charge coupled device. The clock voltages V1-V3 which are applied to the clock electrodes 6-8 vary between the voltage levels 0 and +12 V. The input voltages at the input 11 vary between, for example, 16 and 24 V.

Figure 6:
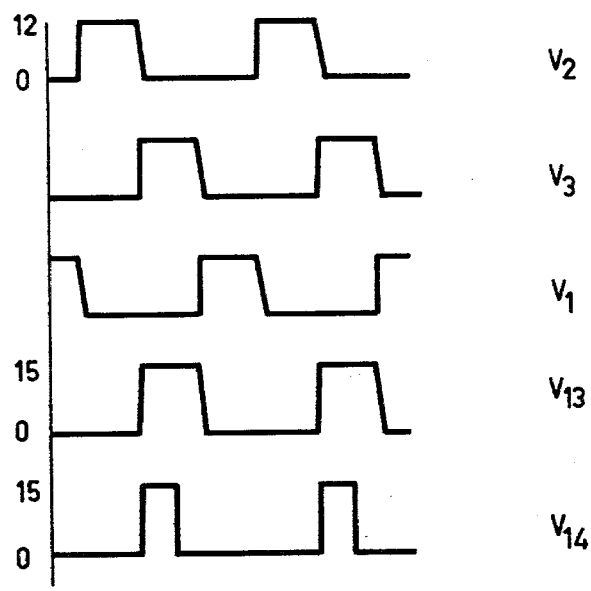
FIG. 6 shows diagrams of clock voltages to be applied in this device as a function of time.

When a clock voltage of +12 V is applied to the clock electrode, a potential well is induced in the layer 3 the minimum of which is situated slightly below the comparatively highly doped surface zone 23. When the size of the charge packet increases, the center of electrical charge, as in the preceding embodiment, will move in the direction towards the surface 2. So in this case also the (relative) charge storage capacity will increase when the size of the charge packets increases. This means that when the same clock voltage would be applied to the input electrode 13, an input characteristic would be obtained as the curve 26 (FIG. 4). By choosing the highest voltage level of the clock voltage which is applied to the electrode 13 by means of the source 15 (during which voltage level the input signal is sampled) to be a few volts higher than the highest level of the clock voltages V1-V3, the minimum of the potential well below the input electrode 13 is situated within the highly doped surface zone 23. During sampling of the input signal, a charge packet is formed below the electrode 13 the center of which, in accordance with the size of the charge packet, does not or at least does not substantially change place in that substantially all charge is stored in the very thin highly doped surface zone 23. FIG. 6 shows diagrammatically the clock voltages V1-V3, the voltage V13 and the clock voltage V14 which are applied to the electrodes 6-8, 13 and 14, respectively.

From a comparison of the voltages V13, V14 in the present embodiment with those in the preceeding embodiment it appears that the voltage steps in the present embodiment are smaller than those in the first embodiment. This difference is caused by the fact that in the second embodiment it is not necessary for the charge below the electrode 13 to be accumulated at the surface 2. The voltage at the input electrode should be increased only so much with respect to the clock voltages V1-V3 that the charge storage begins within the highly doped surface zone 23 and not in the low-doped part 24.

Said clock voltages V1-V3 show a lower amplitude than the voltage V13. When higher clock voltages of the same amplitude as the voltage V13 would be applied to the clock electrodes 6-8 (as a result of which, for example, the electrode 13 could simply be connected to the clock voltage source 10 and the source 15 could be omitted), the dissipation in the device, in particular when the device comprise a very large number of steps (bits), could become very large; by using a higher clock voltage only at the input, a considerable improvement in the input characteristic can be obtained without noteworthy increase in the dissipation.

As in the preceding embodiment, a voltage is applied to the sampling gate 14 the maximum of which is at least equal to the maximum voltage at the input electrode 13 and which consequently is also a few volts higher than the maximum of the clock voltages V1–V3.

Figure 7:
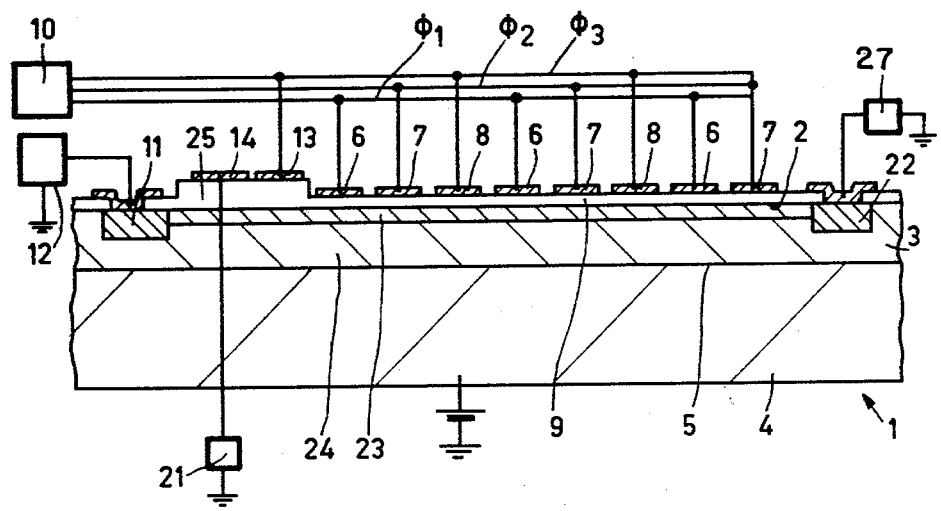
FIG. 7 is a sectional view of still another embodiment of a charge coupled device according to the invention.

In a specific embodiment the clock voltages vary again between the values 12 and 0 V. For the voltages V13 and V14, the values of 15 and 0 V, respectively, were chosen. In this case it appeared that an optimum improvement in the input characteristic can be obtained by choosing the highest level of the voltage V13 to be only 3 V higher than that of the clock voltages V1–V3. Instead of by a separate voltage source 15, the minimum of the potential well below the input electrode 13 can alternatively be moved towards the surface 2 by internal means which are provided in the semiconductor structure itself. FIG. 7 shows an embodiment thereof. As regards the composition of the semiconductor body 1 and the electrode configuration 6, 7 and 8, the device is identical to the preceding embodiment. In the present embodiment the oxide layer 9, at least below the input electrode 13 and preferably also below the sampling electrode 14, comprises a part 25 which is thicker than the part on which the clock electrodes 6, 7 and 8 are provided. When the same voltage is applied to the electrode 13 as to the electrodes 6, 7 and 8, a less strong electric field will be induced from the surface 2 in the semiconductor layer 3 below the electrode 13 than below the electrodes 6, 7 and 8. As a result of this, with equal voltages at the electrodes below the electrodes 13, the potential minimum can be moved in the direction of the surface 2 and the situated in the thin, highly doped surface layer 23. Therefore, the comparatively thick oxide 25 in fact produces the same effect as the extra voltage at the electrode 13 in the preceding embodiment. In this case, however, a clock voltage of the same voltage values as the clock voltages V1–V3 may be applied to the electrode 13. The extra voltage source 15 used in the preceding embodiment may now be omitted by simply connecting the electrode 13 to one of the clock lines, for example φ3.

The amplitude of the clock voltage at the sampling gate electrode 14 may also be equal to the amplitude of the clock voltages V1–V3.

It will be apparent that the invention is not restricted to the embodiments described but that many variations are possible to those skilled in the art without departing from the scope of this invention.

For example, in the last embodiment, instead of a dielectric 9, a shift of the potential minimum below the electrode 13 can be produced by increasing the doping concentration below the electrode 13 with respect to the doping concentration below the clock electrodes 6–8.

What is claimed is:

1. A bulk channel charge coupled device, which comprises:
a semiconductor body having a semiconductor layer of at least substantially one conductivity type situated at a major surface thereof;
means for depleting the semiconductor layer over its whole thickness at least in the absence of a supply of majority charge carriers while avoiding breakdown;
a row of electrodes provided on the surface of the body above the semiconductor layer and separated therefrom by a barrier junction, said row of electrodes being connected to voltage sources for applying clock voltages during operation to cause potential wells for storing and transporting information-representing charge packets to be generated in the interior of the semiconductor layer and separated from the surface;
an input stage having a zone which forms a source of charge carriers and an input electrode which is situated between said zone and said row of electrodes and which is separated from the body by an insulating layer, a potential well being induced in the semiconductor layer during operation by means of said input electrode;
an input signal source for supplying an input signal in the form of a voltage difference between the charge carrier source and the input electrode which determines the size of a packet of charge carriers which flows from the source in the potential well below the input electrode;
means for forming said potential well in said semiconductor layer and below the input electrode during operation, the minimum of said well being situated at a smaller distance from the surface of the body than the potential wells which are induced in the semiconductor layer by means of the clock voltages applied to said electrodes, so that a substantially linear relationship between the size of said charge packet and the magnitude of the input signal is obtained; and
a sampling electrode for sampling the input signal provided between the zone which forms the source of majority charge carriers and said input electrode, said sampling electrode having means for applying a potential in the semiconductor layer during sampling of the input signal which is at most equal to the potential in the potential well below the input electrode.

2. A charge coupled device as claimed in claim 1, wherein during sampling of the input signal a voltage is applied to the sampling electrode which has a value at least substantially equal to the voltage applied to the input electrode.

3. A bulk channel charge coupled device, which comprises:
a semiconductor body having a semiconductor layer of at least substantially one conductivity type situated at a major surface thereof;
means for depleting the semiconductor layer over its whole thickness at least in the absence of a supply of majority charge carriers while avoiding breakdown;
a row of electrodes provided on the surface of the body above the semiconductor layer and separated therefrom by a barrier junction, said row of electrodes being connected to voltage sources for applying clock voltages during operation to cause potential wells for storing and transporting information-representing charge packets to be generated in the interior of the semiconductor layer and separated from the surface;
an input stage having a zone which forms a source of charge carriers and an input electrode which is situated between said zone and said row of electrodes and which is separated from the body by an insulating layer, a potential well being induced in the semiconductor layer during operation by means of said input electrode;

an input signal source for supplying an input signal in the form of a voltage difference between the charge carrier source and the input electrode which determines the size of a packet of charge carriers which flows from the source in the potential well below the input electrode;

means for forming said potential well in said semiconductor layer and below the input electrode during operation, the minimum of said well being situated at a smaller distance from the surface of the body than the potential wells which are induced in the semiconductor layer by means of the clock voltages applied to said electrodes, so that a substantially linear relationship between the size of said charge packet and the magnitude of the input signal is obtained, at least that part of the semiconductor layer underlying the input electrode comprising a surface zone of said one conductivity type which extends from the surface of the body down through only a part of the thickness of the semiconductor layer and which has a higher doping concentration than the adjoining part of the semiconductor layer, said more highly doped surface zone of the one conductivity type extending below the input electrode and also below the whole row of insulated electrodes in the semiconductor layer, the barrier junction separating said row of electrodes from the surface of the body comprising said insulating layer, and said insulating layer being thicker beneath said input electrode than beneath said row of electrodes.

4. A charge coupled device as claimed in claim 3, further comprising a sampling electrode for sampling the input signal provided on said insulating layer and between the zone which forms the source of majority charge carriers and said input electrode, said sampling electrode having means for applying a potential in the semiconductor layer during sampling of the input signal which is at most equal to the potential in the potential well below the input electrode, said insulating layer being thicker beneath said sampling electrode than beneath said row of electrodes.

* * * * *